US011269108B2

(12) United States Patent
Sieg

(10) Patent No.: US 11,269,108 B2
(45) Date of Patent: Mar. 8, 2022

(54) DOOR HANDLE ASSEMBLY FOR A MOTOR VEHICLE HAVING A CAPACITIVE SENSOR AND NEAR-FIELD COMMUNICATION

(71) Applicant: Berthold Sieg, Bottrop (DE)

(72) Inventor: Berthold Sieg, Bottrop (DE)

(73) Assignee: Huf Hülsbeck & Fürst GmbH & Co. KG, Velbert (DE)

( * ) Notice: Subject to any disclaimer, the term of this patent is extended or adjusted under 35 U.S.C. 154(b) by 367 days.

(21) Appl. No.: 16/498,887

(22) PCT Filed: Dec. 20, 2017

(86) PCT No.: PCT/EP2017/083689
§ 371 (c)(1),
(2) Date: Sep. 27, 2019

(87) PCT Pub. No.: WO2018/177580
PCT Pub. Date: Oct. 4, 2018

(65) Prior Publication Data
US 2021/0173113 A1 Jun. 10, 2021

(30) Foreign Application Priority Data
Mar. 30, 2017 (DE) .................... 10 2017 106 869.4

(51) Int. Cl.
*G01R 27/26* (2006.01)
*G01V 3/08* (2006.01)
(Continued)

(52) U.S. Cl.
CPC .............. *G01V 3/088* (2013.01); *E05B 81/77* (2013.01); *H05K 1/0218* (2013.01); *H05K 1/162* (2013.01);
(Continued)

(58) Field of Classification Search
CPC ...... G01V 3/088; E05B 81/77; H05K 1/0218; H05K 1/162; H05K 1/165; H05K 2201/10151
See application file for complete search history.

(56) References Cited

U.S. PATENT DOCUMENTS 11,005,180 B2 *   5/2021   Mu ......................... G06F 3/041
2009/0167699 A1 *  7/2009   Rosenblatt ....... G06K 19/07749
                                                      345/173
(Continued)

FOREIGN PATENT DOCUMENTS

GB          2409842 A          7/2005
WO    WO 2012/048770 A1        4/2012
WO    WO 2014/146949 A1        9/2014

OTHER PUBLICATIONS

International Search Report of International Application No. PCT/EP2017/083689 dated Apr. 11, 2018, 6 pages.
(Continued)

*Primary Examiner* — Binh B Tran
(74) *Attorney, Agent, or Firm* — Fay Sharpe LLP

(57) ABSTRACT

A sensor device for a motor vehicle includes a printed circuit board on which a sensor electrode of a capacitive sensor is formed. An inductive near-field transmission device is formed with a near-field transmission coil which has a turn on the printed circuit board. The near-field transmission coil and the sensor electrode are arranged relative to each other in such a way that the sensor electrode lies in the inner region of the near-field transmission coil surrounded by the turn. The sensor electrode includes an elongated central conductor and extending therefrom are a plurality of branch conductors. The branch conductors are spaced in such a way that they are galvanically coupled exclusively via the central conductor and are arranged on the central conductor on opposite sides in pairs.

12 Claims, 3 Drawing Sheets

(51) Int. Cl.
*E05B 81/76* (2014.01)
*H05K 1/02* (2006.01)
*H05K 1/16* (2006.01)

(52) U.S. Cl.
CPC ... *H05K 1/165* (2013.01); *H05K 2201/10151* (2013.01)

(56) References Cited

U.S. PATENT DOCUMENTS

| | | | | |
|---|---|---|---|---|
| 2013/0162594 | A1* | 6/2013 | Paulsen | H01Q 1/22 |
| | | | | 345/174 |
| 2017/0235386 | A1* | 8/2017 | Alm | H03K 17/9535 |
| | | | | 345/174 |
| 2020/0091608 | A1* | 3/2020 | Alpman | H01Q 1/38 |

OTHER PUBLICATIONS

International Preliminary Report on Patentability of International Application No. PCT/EP2017/083689 dated Apr. 11, 2018, and English translation, 11 pages.

\* cited by examiner

DOOR HANDLE ASSEMBLY FOR A MOTOR VEHICLE HAVING A CAPACITIVE SENSOR AND NEAR-FIELD COMMUNICATION

BACKGROUND

The invention relates to a sensor device for a motor vehicle, which has an at least single-layer printed circuit board on which a sensor electrode of at least one capacitive sensor is formed. An inductive near-field transmission device is formed with a near-field transmission coil having at least one turn extending on the at least one-layer printed circuit board. Control electronics are coupled to both the sensor electrode and the near-field transmission device.

Sensor devices with integrated capacitive sensors are generally known, in particular their use in door outer handles of motor vehicles. For example, DE 196 17 038 A1 discloses a door handle with capacitive sensors to detect an approach of a potential operator.

Such a capacitive proximity sensor comprises a sensor electrode and a control and evaluation circuit. The control and evaluation circuit measures the capacitance of the electrode with respect to ground. By the approach of a hand of the operator, the capacitance of the electrode is changed, and the capacitance change is detected by the control and evaluation circuit.

As soon as the sensor has detected an approach, a wake-up signal from a keyless entry system can thereby be emitted.

It is also known that users of motor vehicles in everyday life wish to be burdened as little as possible by carried devices and keys for motor vehicles. Therefore, there is a desire to also legitimize functions of the motor vehicle by the use of devices carried by the user with another main function. These may be, for example, mobile phones. For exchanging information between a mobile device and the vehicle, near-field transmission devices can be used as the communication interface. In particular, communication interfaces according to the NFC standard are established and already installed in numerous mobile devices.

WO 2014/146949 A1 describes a vehicle door handle with both a capacitive electrode and a near-field transmission device, for example. There, both a transmission coil of a near-field device and a capacitive sensor electrode are arranged on one and the same printed circuit board.

The installation space within a control element on the vehicle, such as a door handle, is limited. However, both the capacitive sensor and the near-field transmission device can be made to be more sensitive, the more space is available for their sensitive elements, i.e. the sensor electrode and the near-field transmission coil.

The object of the invention is to provide an improved sensor device for motor vehicles, which has an improved use of installation space with optimized sensitivity.

BRIEF SUMMARY

This object is achieved by a sensor device having the features of patent claim 1.

The sensor device according to the invention of the aforementioned type is designed so that the sensor electrode is formed in an inner region encompassed by the turn of the near-field transmission coil.

Both the near-field transmission coil and the sensor electrode may be formed as conductor tracks and conductor surfaces on the printed circuit board. They can be formed both on the same level of the circuit board, as well as, in a multilayer printed circuit board, on different levels of the circuit board. However, in any case, the near-field transmission coil defines an inner region which is within the turn but is not covered by it. It is therefore the turn-free inner region and its projections running in the winding axis over the layers or levels of the printed circuit board. The sensor electrode is formed in this free inner region of the near-field transmission coil.

According to the invention, the sensor electrode is designed with a special geometry in order to minimize the eddy currents in the sensor electrode. During operation of the near-field transmission device, eddy currents are induced in the sensor electrode in the free inner region of the coil. These eddy currents produce a magnetic field, which counteracts the generating magnetic field and thus considerably limits the communication capability of the near-field transmission device. According to the invention, the sensor electrode is formed with an elongated central conductor and a plurality of branch conductors extending from the central conductor. In this case, the branch conductors are arranged spaced apart from one another along the central conductor, so that the branch conductors protrude from the central conductor and are galvanically coupled to one another only via the central conductor, as if they were branches. The branch conductors have on their side facing away from the central conductor free (not electrically coupled with other components) ends. In addition, the branch conductors are each arranged on opposite sides in pairs on the central conductor, so that for each branch conductor an associated branch conductor is formed on the respectively opposite side of the central conductor. All conductors, central conductors and branch conductors can be designed as conductor tracks on one level of the printed circuit board.

The central conductor together with the branch conductors forms the sensor electrode and forms a kind of fir branch structure or two-sided comb structure. In principle, the branch conductors may assume any desired shape, but they may not form closed ring structures with each other and with the central conductor, in which larger eddy current areas can form.

According to the invention, a sensor electrode is formed in this way, which partially occupies a detection area with conductor structures, but without providing space for the formation of larger eddy current areas. It has been shown that in this way both a reliable detection of the capacitive sensor is possible, as well as a sensitive operation of the near-field transmission coil. Since one and the same surface area of the printed circuit board can be used both for the capacitive sensor electrode and for the near-field transmission device, a more compact design of the sensor device is possible, or a further extension of the sensitive region of both the near-field transmission device and the capacitive sensor device.

Both the near-field transmission coil and the sensor electrode can be controlled in a conventional manner, that is, for example, as described in the aforementioned prior art. A further advantage of the arrangement according to the invention is that the parasitic capacitances occurring between the conducting paths of the near-field transmission coil and the sensor electrode are reduced.

In an advantageous embodiment of the invention, all pairs of branch conductors are each symmetrical to each other. This means that with respect to the point of attachment of the branch conductors to the central conductor, each pair of branch conductors is symmetrical with respect to its length, width and shape.

In this way, unintentionally induced voltages in the conductive electrode surfaces of the capacitive sensor can be reduced during the operation of the near-field device.

In a further development of the invention, the branch conductors are all straight and stretched and arranged at a uniform branch angle to the central conductor. The uniform straight formation of branch conductors and the uniform branch angle lead to a uniform distance of the central conductors to each other. Accordingly, inductive and capacitive effects between the central conductors are uniform over their length with the least possible variation.

In a development of this design, the branch angle is 90°, so that the branch conductors form a two-sided comb structure with the central conductor. Such an arrangement ensures that a uniform effect of the branch conductors occurs with respect to the central conductor over its entire length, since the branch conductor density varies as little as possible in the region around the central conductor. In the case of oblique branch conductors, on the other hand, surface areas which are offset to the central conductor may result, which have a different surface density than the branch conductors. This may be desired or advantageous in individual cases. However, the branch angles of 90° ensure a uniform area density and a particularly reliable cancellation of undesired induced voltages in the sensor electrode.

In a preferred embodiment of the sensor device according to the invention, the branch conductors, starting from the central conductor, are formed over the entire length with a constant width. While the sensor device can basically have branch conductors which have broadened regions and tapered regions, a constant width of the branch conductors is provided in this design. This design also allows for simplified production and ensures that the distance between the branch conductors to one another remains constant over their extension length.

A further preferred embodiment of the sensor device according to the invention provides that all branch conductors have uniform distances from their adjacent branch conductors. While in general the distances of the branch conductor pairs along the central conductor can vary, the uniform distribution of the branch conductors over the length of the central conductor is advantageous for the best possible surface coverage of the sensor electrode.

According to a preferred embodiment of the invention, the distances between adjacent branch conductors are dimensioned to correspond to a 0.1 to 10 times the width of the adjacent branch conductors. The area occupied by the branch conductors and the free space formed between the branch conductors may accordingly be accompanied by a proportionately larger area occupancy of the free area or proportionately greater occupancy by the branch conductors. Which of these designs is to be chosen depends on the dimensioning of the sensor electrode and the overall device, but can be easily optimized empirically in simulation calculations.

It is essential that within the scope of the manufacturing tolerances, the adjacent branch conductors are always galvanically separated, except for the connection via the central conductor.

The near-field transmission coil may be formed with a rectangular coil cross-section on the circuit board and thereby the central conductor of the sensor electrode may be formed along an axis of symmetry of the coil cross-section. Accordingly, if the near-field transmission coil is guided around a portion of the circuit board in accordance with a rectangular area, the central conductor of the sensor electrode may be formed along the center axis of this rectangle, with the branch conductors extending to two sides of this central conductor. The arrangement at this position is advantageous because a symmetrical center axis forms the minimum induction voltage, and thus unwanted induced voltages are kept as small as possible in the sensor electrode.

It is possible in a development of the invention to provide a multilayer board for forming the sensor device, wherein the sensor electrode is disposed on one layer of the multilayer board and on at least one further level of the multilayer board, in particular below, an electrode (also shield electrode) is formed which is congruent to the sensor electrode, or also as a reference electrode. The shield electrode can also be formed on all sides with a projection, which further improves the shielding effect. At a distance of the layers of e.g. 600 µm, the projection should be at least 0.5 mm on all sides.

The arrangement of capacitive sensor devices with shield electrodes and sensor electrodes and reference electrode is known in the art. In the context of the invention, the electrodes are congruent or overlapping on all sides, that is, aligned with substantially the same geometry and congruent perpendicular to the circuit board level. In this way, the sensor device achieves the known advantages of a sensor device with sensor electrode and shield electrode and reference electrode, while at the same time the mentioned advantages of the invention are achieved. In addition, the near-field transmission coil may have turns on different levels of the circuit board.

According to an advantageous embodiment of the invention, the control device of the sensor device is also designed so that the sensor electrode is always set to a ground potential when the near-field transmission coil is activated for transmission. In addition, the near-field transmission coil should always be grounded when the sensing electrode is activated for sensing. The respective non-active element, the near-field transmission coil on the one hand and the sensor electrode on the other hand, are deactivated and set to a ground potential, so as not to disturb the operation of the respective active element.

BRIEF DESCRIPTION OF THE DRAWINGS

The invention will now be explained in more detail with reference to the accompanying drawings.

DETAILED DESCRIPTION

Figure 1:
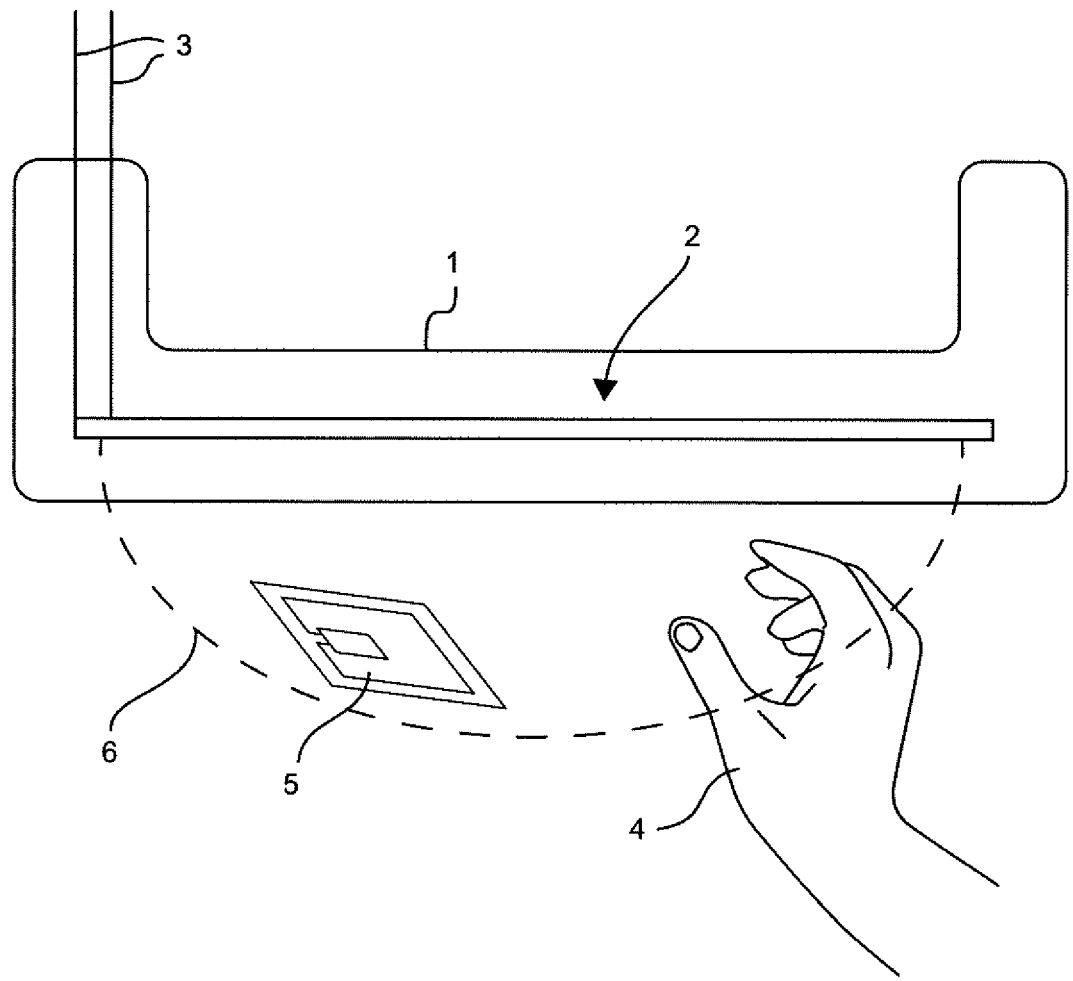
FIG. 1 shows schematically a vehicle door handle with a sensor arrangement according to the invention and its detection field.

In FIG. 1, a vehicle door handle 1 is shown. In the vehicle door handle 1, a sensor arrangement 2 according to the invention is arranged. Leads 3 lead from the sensor arrangement 2 to a vehicle-side central control device.

The sensor device 2 according to the invention, which is described in more detail with reference to the further figures, forms a detection field 6. For this purpose, the sensor device 2 has both a capacitive sensor region, which detects the approach of a hand 4, and a near-field transmission device, which detects an NFC mobile device 5. The corresponding interfaces are activated alternately at the sensor device, i.e. with a time delay.

As can be seen from FIG. 1, the detection area 6 expands over nearly the entire extent of the sensor device 2. The detection area 6 is shown schematically here uniformly for the detection of a near-field transmission as well as the capacitive detection, but this is only to be understood symbolically. In any case, the capacitive detection areas and the detection of a near-field transmission device 5 have overlapping areas.

Figure 2:
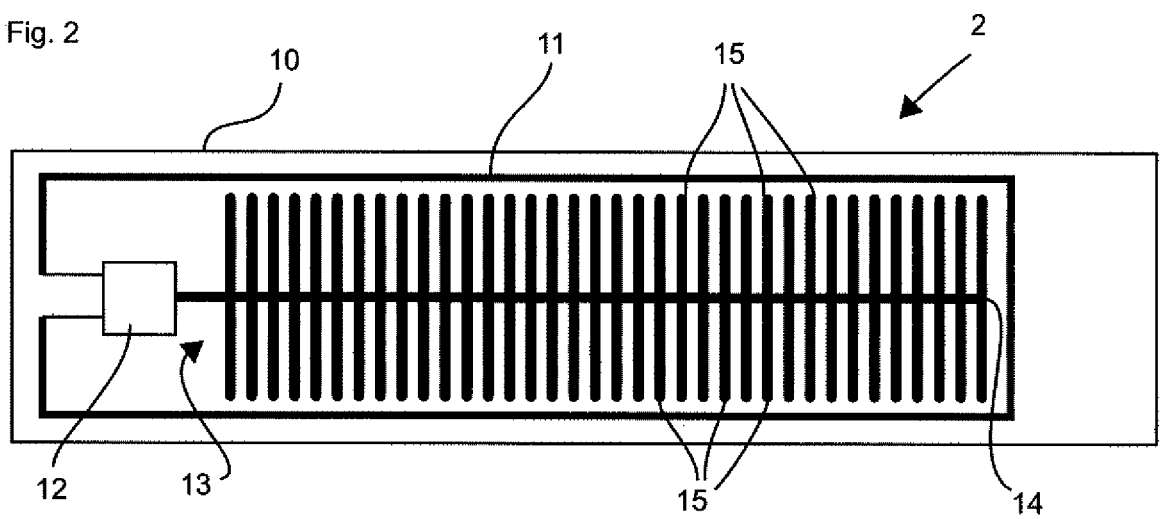
FIG. 2 shows schematically a structure of a sensor arrangement according to the invention according to a first embodiment.

FIG. 2 shows the sensor device 2 from FIG. 1 according to a first exemplary embodiment. A printed circuit board 10 is formed in this illustration as a single-layer printed circuit board. A turn 11 of a near-field transmission coil runs around the edge region of the printed circuit board 10. The turn 11 is coupled to the control electronics 12, with which together it forms a near-field transmission device. The control electronics 12 has an NFC reader chip and a microcontroller coupled thereto. The turn 11 is coupled to the NFC reader chip and via this to the microcontroller.

A sensor electrode 13 is also coupled with the control electronics 12, wherein the sensor electrode is not coupled to the NFC reader chip but directly to the microcontroller. This has a central conductor 14 and a multiplicity of branch conductors 15. The branch conductors are only partially provided with reference numerals in order not to make the picture confusing. The branch conductors 15, together with the central conductor 14, form the sensor electrode, which is located within the region of the printed circuit board 10 that is encompassed by the near-field transmission coil 11. The central conductor 14 is formed along the symmetry axis of the near-field transmission coil 11.

Between the branch conductors 15, unoccupied, conductor-free spaces are formed, so that the branches are galvanically coupled only via the central conductor 14. The branch conductors in this embodiment all have the same length and extend in mirror symmetry from the central conductor 14 to form a double comb structure. The distances of the branch conductors 15 are all uniform in this representation, as well as the length. In addition, the branch conductors 15 are straight.

The sensor electrode 13 is activated for detection in temporal change with the near-field transmission device and the associated near-field transmission coil 11. The burr-like structure of the sensor electrode 13 makes it possible to construct the magnetic field constituted by the near-field transmission coil 11 for coupling with an NFC-capable device without major disturbances (performance loss).

Figure 3:
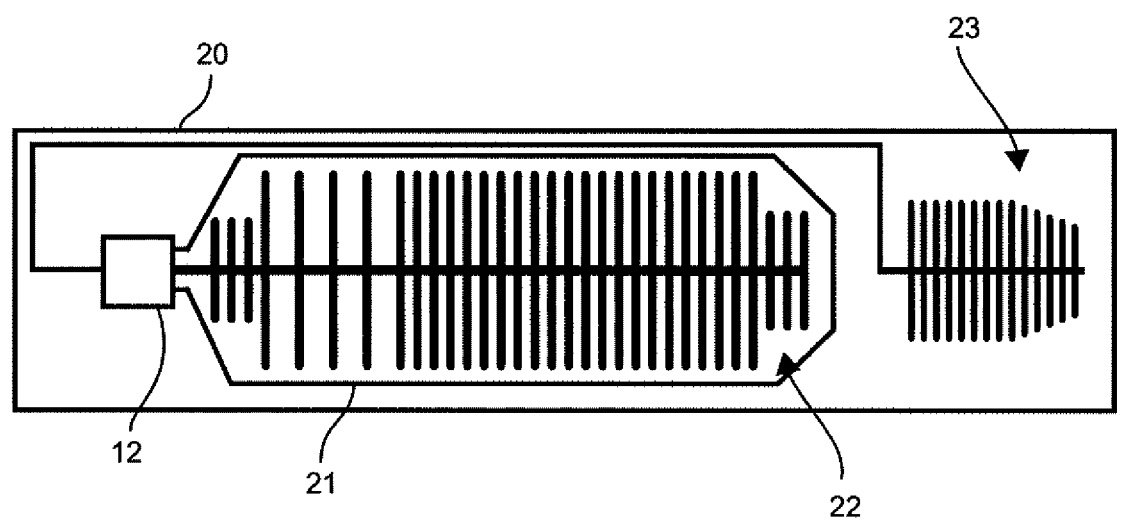
FIG. 3 shows schematically the structure of a sensor arrangement according to the invention according to a second embodiment.

FIG. 3 shows an alternative design of a sensor device according to an alternative exemplary embodiment. In this design, a printed circuit board 20 is formed, which has a control device 12. A turn 21 is formed as a conductor track on the circuit board 20 to form a near-field transmission coil. A sensor electrode 22 is formed within the inner free area of the near-field transmission coil 21. In this illustration, it can be seen that the sensor electrode 22 has a central conductor with branch conductors of different lengths. In addition, the branch conductor pairs are arranged at different distances along the central conductor. The central conductor is formed along the symmetry axis of the near-field transmission coil 21. Furthermore, the control electronics 12 are formed with a second sensor electrode 23 which is outside the near-field transmission coil. Again, this has a symmetrical structure with a plurality of branch conductors, which are spaced from each other.

In this exemplary embodiment, it is clear that the invention can be realized with different distances between the branch conductors and also with different lengths of the branch conductors. However, the branch conductors are arranged in pairs symmetrically on the central conductor.

The example shown serves in practice, for example in the door handle, to delimit an area for a door opening, detected by the sensor electrode 22, from a region for the door closing, detected by the electrode 23. It would in principle be possible to form a further near-field transmission coil around the electrode 23 as well.

FIGS. 2 and 3 show correspondingly different embodiments of the sensor device according to the invention. It becomes clear that the devices can be formed with different division ratios. The width of the branch conductors and the central conductor is application-dependent. Typical widths of the branch conductors are, for example, 0.3 mm to 2 mm. The distances can be, for example, 0.3 mm to 2 mm. However, the widths of the branch conductors can also be chosen significantly larger, for example, up to 3 or 5 mm, and the distances can be smaller.

The number of branch conductors can also be varied. Usually, however, it is necessary to provide at least a number of five branch conductor pairs on one central conductor, wherein considerably more branch conductor pairs, for example 20 to 100 branch conductor pairs, can be provided.

Figure 4A:
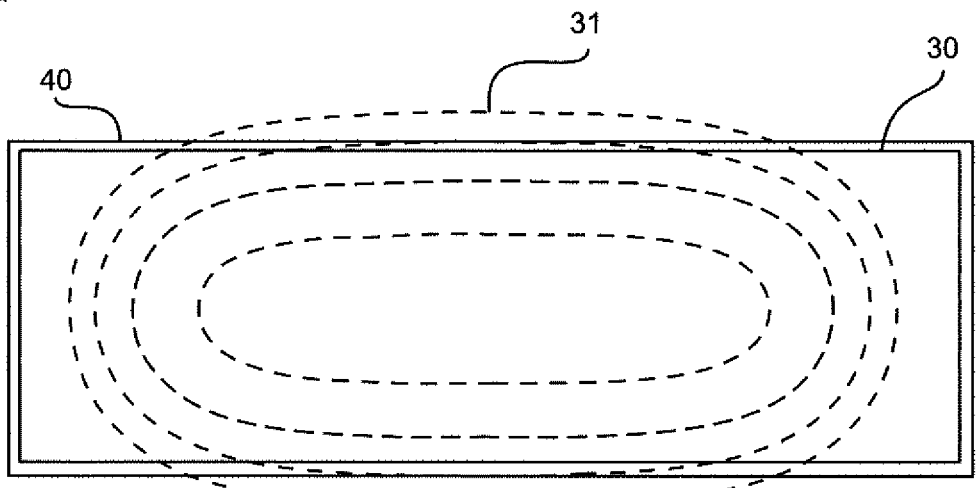
FIGS. 4a, 4b and 4c show schematically a magnetic field distribution of a near-field transmission coil at different occupancies of an interior with conductor structures.
Figure 4B:
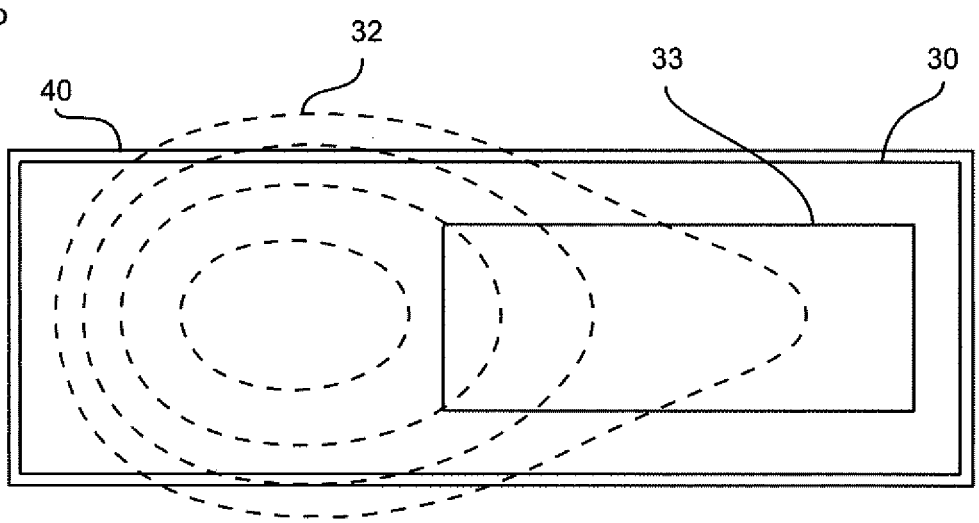
Figure 4C:
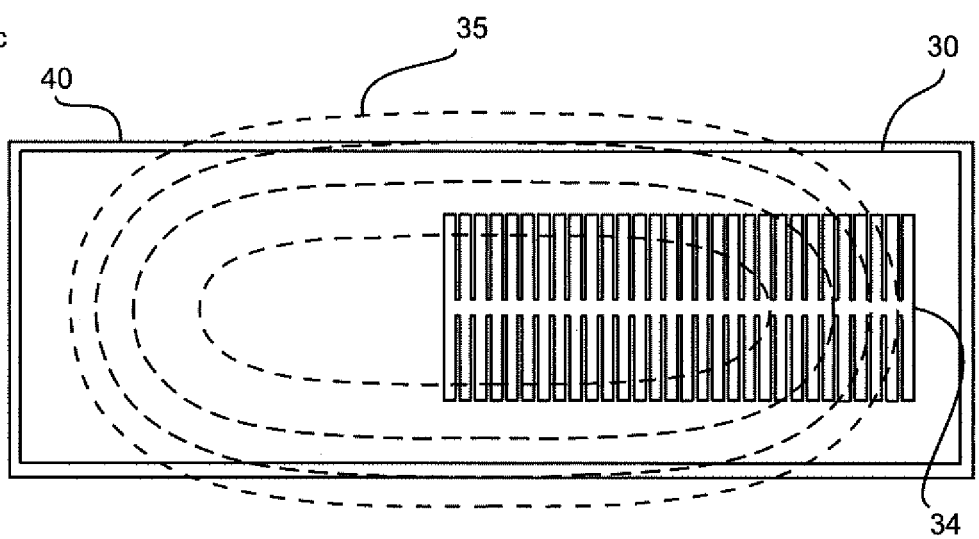

FIGS. 4a to 4c show a schematic representation of the results of simulation calculations. Shown is a conductor loop 30 on a printed circuit board 40, which builds up a magnetic field with a corresponding current supply. The dashed lines 31 show the courses of the same magnetic field strengths.

In FIG. 4a, no electrically conductive material is applied in the interior of the conductor loop 30 of a printed circuit board 40. Accordingly, a magnetic field according to the lines 31 forms.

In contrast, FIG. 4b shows a conventional sensor electrode with an electrode surface 33 as a solid surface. With such a solid surface 33, the magnetic field according to the line 32 is considerably weakened and concentrates essentially on the unoccupied free area within the turn 30.

In contrast, the sensor arrangement according to the invention is shown in FIG. 4c, wherein the solid area 33 has been replaced by a sensor electrode 34 with a central conductor and a multiplicity of branch conductors. The branch conductors each have distances from each other, which prevent formation of eddy currents of a large diameter. In addition, the central conductor is arranged along an axis of symmetry of the coil 30. The simulation calculations show that a generated magnetic field 35 is only slightly weaker than the magnetic field 31 of FIG. 4a without a sensor electrode. Accordingly, both the coupling of the turn 30 and the sensor electrode 34 can be used with better utilization of the installation space.

FIG. 4c shows by way of example an arrangement of the branch conductors, wherein the widths of the respective branch conductors are greater than the spacings of the branch conductors from one another. However, as described above, this ratio of widths of the branch conductors to the spacing of the branch conductors can be varied to a considerable extent.

The invention claimed is:
1. Sensor device for a motor vehicle, comprising
an at least single-layer printed circuit board on which a sensor electrode of at least one capacitive sensor is formed,
an inductive near-field transmission device, wherein the inductive near-field transmission device com- prises a near-field transmission coil having at least one turn, wherein the at least one turn is formed on said at least single-layer printed circuit board;

an electronic control unit which is coupled to the sensor electrode and the near-field transmission device, wherein the near-field transmission coil and the sensor electrode are arranged relative to one another in such a way that the sensor electrode is formed in an inner region of the near-field transmission coil surrounded by the at least one turn, the sensor electrode having an elongated central conductor and a plurality of branch conductors which extend from the central conductor, wherein the branch conductors extend out from the central conductor with spacing in such a way that the branch conductors are galvanically coupled exclusively by the central conductor, wherein the branch conductors are each arranged on the central conductor on opposite sides in pairs such that, for each branch conductor, an associated branch conductor is formed on the opposite side of the central conductor.

2. A sensor device according to claim 1, wherein each pair of branch conductors is symmetrical with respect to the central conductor.

3. A sensor device according to claim 1, wherein all branch conductors are straight and branch off at a uniform branch angle to the central conductor.

4. A sensor device according to claim 3, wherein the branch angle is 90 degrees and thus the branch conductors form a two-sided comb structure with the central conductor.

5. A sensor device according to claim 1, wherein each branch conductor extends from the central conductor with a width that is constant over its entire length.

6. A sensor device according to claim 1, wherein all branch conductors have a uniform width.

7. A sensor device according to claim 1, wherein all branch conductors have uniform spacing from their adjacent branch conductors.

8. A sensor device according to claim 1, wherein the distances between adjacent branch conductors are between 0.5 times and 5 times larger than a width of the adjacent branch conductors.

9. A sensor device according to claim 1, wherein the branch conductors each have a width of between 0.1 mm and 1 mm and wherein distances between adjacent branch conductors are between 0.1 mm and 1 mm.

10. A sensor device according to claim 1, wherein the near-field transmission coil has a rectangular coil cross section, wherein the central conductor of the sensor electrode is formed along an axis of symmetry of the coil cross-section.

11. A sensor device according to claim 1, wherein the sensor device is formed on a multilayer board, wherein the sensor electrode is disposed on a layer of the multilayer board and on at least one further layer of the multilayer board, an electrode (shield electrode) is formed which is congruent to the sensor electrode, or also as a reference electrode.

12. A sensor device according to claim 1, wherein the control device is designed
   to then set the sensor electrode to a ground potential when the near-field transmission coil is activated for transmission, and
   the near-field transmission coil then to be set to a ground potential when the sensor electrode is activated for sensing.

* * * * *